(12) United States Patent
Ke et al.

(10) Patent No.: US 9,070,622 B2
(45) Date of Patent: Jun. 30, 2015

(54) SYSTEMS AND METHODS FOR SIMILARITY-BASED SEMICONDUCTOR PROCESS CONTROL

(71) Applicant: Taiwan Semiconductor Manufacturing Company, Ltd., Hsin-Chu (TW)

(72) Inventors: Chih-Ming Ke, Hsinchu (TW);
Ching-Pin Kao, Tainan (TW);
Yang-Hung Chang, Taipei (TW);
Kai-Hsiung Chen, New Taipei (TW);
Chun-Ming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/026,753

(22) Filed: Sep. 13, 2013

(65) Prior Publication Data
US 2015/0079700 A1    Mar. 19, 2015

(51) Int. Cl.
| G06F 17/50 | (2006.01) |
|---|---|
| G06F 19/00 | (2011.01) |
| G21K 5/00 | (2006.01) |
| G01R 31/26 | (2014.01) |
| G06K 9/00 | (2006.01) |
| H01L 21/66 | (2006.01) |
| G03F 1/36 | (2012.01) |
| G03F 1/00 | (2012.01) |
| G03F 1/70 | (2012.01) |
| G03F 1/68 | (2012.01) |

(52) U.S. Cl.
CPC ............ *H01L 22/26* (2013.01); *G06F 17/5068* (2013.01); *G05B 2219/45031* (2013.01); *G03F 1/144* (2013.01); *G05B 2219/45029* (2013.01); *G03F 1/36* (2013.01); *G03F 1/70* (2013.01); *G03F 1/68* (2013.01)

(58) Field of Classification Search
USPC .............. 716/50–56; 382/141, 144, 145, 151; 438/14; 700/120–121; 378/34–35
See application file for complete search history.

(56) References Cited

U.S. PATENT DOCUMENTS

| 5,711,848 | A  | * | 1/1998  | Iturralde ........................ 438/14 |
|---|---|---|---|---|
| 6,804,563 | B1 | * | 10/2004 | Lafaye de Micheaux ...... 700/51 |
| 6,973,636 | B2 | * | 12/2005 | Shin et al. ........................ 716/51 |
| 7,177,010 | B2 | * | 2/2007  | Van Der Laan et al. ......... 355/67 |
| 7,284,230 | B2 | * | 10/2007 | Bergman Reuter et al. .... 716/52 |
| 7,383,521 | B2 | * | 6/2008  | Smith et al. .................... 716/114 |
| 7,541,201 | B2 | * | 6/2009  | Ghinovker ....................... 438/16 |
| 7,583,833 | B2 | * | 9/2009  | McIntyre et al. ............. 382/149 |

(Continued)

*Primary Examiner* — Stacy Whitmore
(74) *Attorney, Agent, or Firm* — Haynes and Boone, LLP

(57) ABSTRACT

The present disclosure provides methods and systems for providing a similarity index in semiconductor process control. One of the methods disclosed herein is a method for semiconductor fabrication process control. The method includes steps of receiving a first semiconductor device wafer and receiving a second semiconductor device wafer. The method also includes a step of collecting metrology data from the first and second semiconductor device wafers. The metrology data includes a first set of vectors associated with the first semiconductor device wafer and a second set of vectors associated with the second semiconductor device wafer. The method includes determining a similarity index based in part on a similarity index value between a first vector from the first set of vectors and a second vector from the second set of vectors and continuing to process additional wafers under current parameters when the similarity index is above a threshold value.

20 Claims, 13 Drawing Sheets

(56) References Cited

U.S. PATENT DOCUMENTS

| | | | |
|---|---|---|---|
| 8,041,103 B2* | 10/2011 | Kulkarni et al. | 382/144 |
| 8,185,230 B2* | 5/2012 | Miller et al. | 700/121 |
| 8,620,468 B2* | 12/2013 | Moyne | 700/109 |
| 8,688,256 B2* | 4/2014 | Cheng et al. | 700/121 |
| 2002/0072003 A1* | 6/2002 | Brill et al. | 430/30 |
| 2005/0086629 A1* | 4/2005 | Shin et al. | 716/21 |
| 2005/0192698 A1* | 9/2005 | Cheng et al. | 700/121 |
| 2006/0129257 A1* | 6/2006 | Chen et al. | 700/96 |
| 2007/0233305 A1* | 10/2007 | Werkman et al. | 700/121 |
| 2012/0017183 A1* | 1/2012 | Ye et al. | 716/52 |
| 2013/0028505 A1* | 1/2013 | Dmitriev et al. | 382/144 |
| 2014/0036243 A1* | 2/2014 | Beyer et al. | 355/52 |

\* cited by examiner

SYSTEMS AND METHODS FOR SIMILARITY-BASED SEMICONDUCTOR PROCESS CONTROL

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

The pursuit of smaller feature size has required a number of technological changes, including changes in the control of fabrication processes. In a semiconductor fabrication facility, often referred to as a "fab," monitoring the results of process steps has become even more critical. Misalignment, lithography defects, and tool drift can result in a process generating unsatisfactory results even after a period of time with satisfactory results. In order to monitor and control the various processes performed in semiconductor device fabrication, techniques have been developed including reliance on comparing wafers in terms of mean, 3-sigma, maximum, and/or minimum differences. While the techniques have provided certain benefits in semiconductor process control to date, they have not been entirely satisfactory.

BRIEF DESCRIPTION OF THE DRAWINGS

It is emphasized that, in accordance with the standard practice in the industry, various features are not drawn to scale. In fact, the dimensions of the various features may be arbitrarily increased or reduced for clarity of discussion.

Aspects of the figures in the present disclosure are best understood from the following detailed description when read in connection with the figures.

DETAILED DESCRIPTION

It is to be understood that the following disclosure provides many different embodiments, or examples, for implementing different features of the invention. Specific examples of components and arrangements are described below to simplify the present disclosure. It will be apparent, however, to one skilled in the art that the disclosed embodiments may be practiced without some or all of these components arranged as described or with additional components. The specific examples presented are meant to be illustrative, but not limiting. One skilled in the art may realize other material that, although not specifically described herein, is within the scope and spirit of this disclosure.

Additionally, some of the embodiments include non-transient, machine-readable media that include executable code that when run by a processor, may cause the processor to perform the steps of methods and perform functions described herein. Some common forms of machine-readable media that may be used include, for example, floppy disks, flexible disks, hard disks, magnetic tapes, any other magnetic media, CD-ROM, any other optical media, RAM, PROM, EPROM, any other memory chip or cartridges, and/or any other media from which a processor or computer is adapted to read.

Figure 1A:
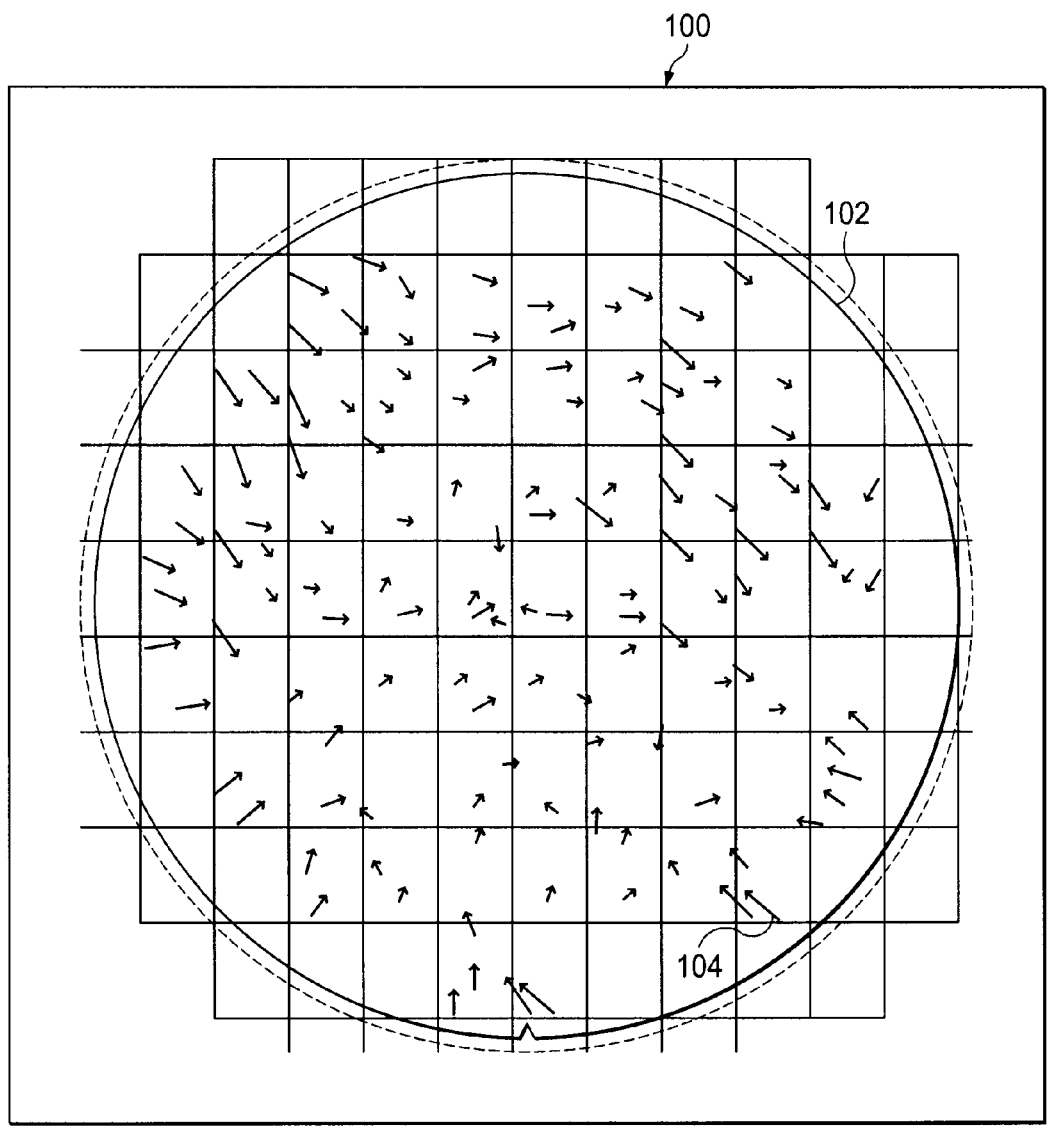
FIGS. 1A and 1B illustrate metrology data obtained from two wafers on top of visual representations of the two wafers according to some embodiments of the present disclosure.
Figure 1B:
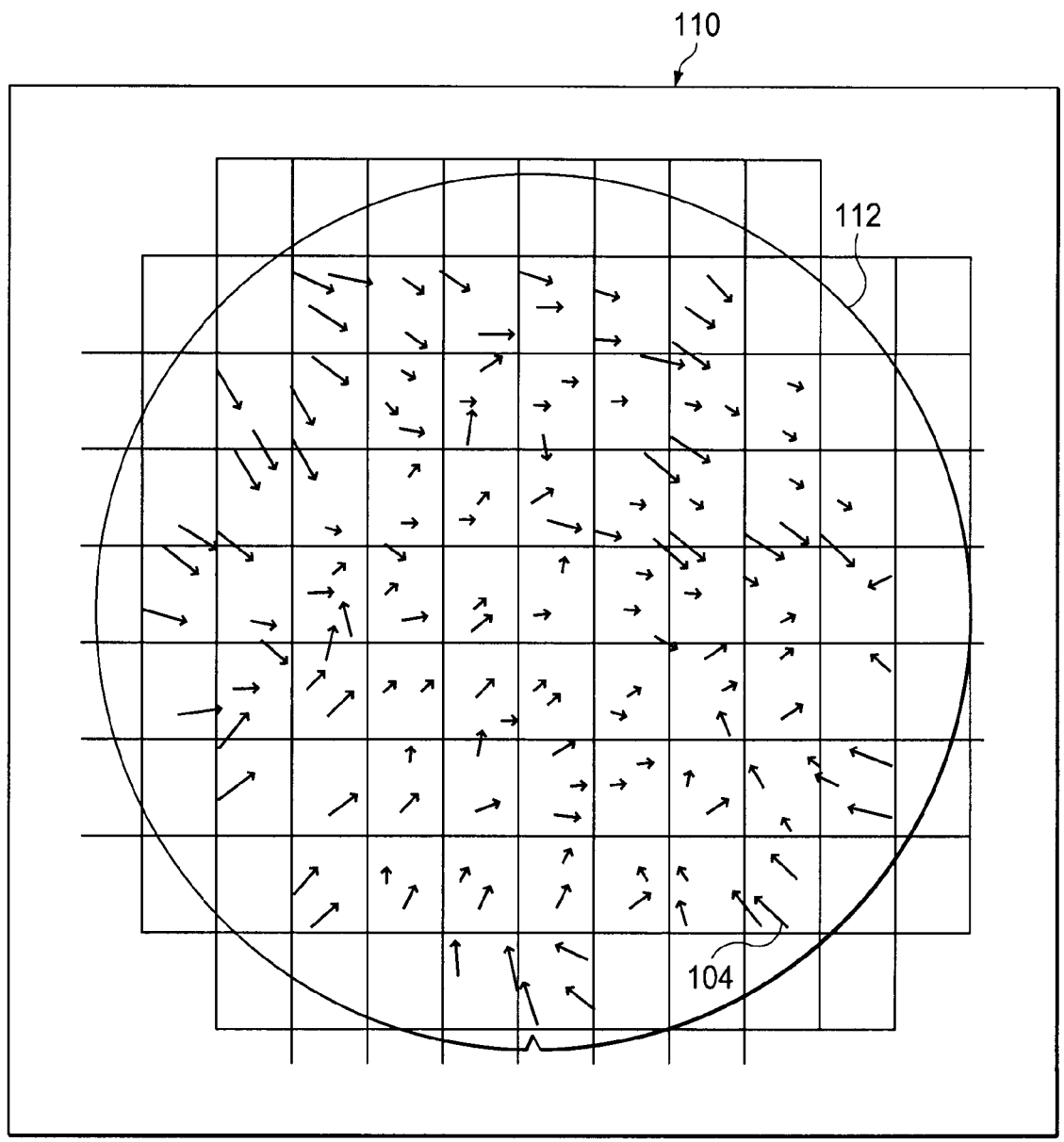

FIGS. 1A and 1B illustrate metrology data obtained by a metrology system from two wafers as depicted on top of visual representations of the two wafers according to some embodiments of the present disclosure. FIG. 1A is a visual depiction 100 of metrology data for a first wafer 102, while FIG. 1B is a visual depiction 110 of metrology data for a second wafer 112. First wafer 102 and second wafer 112 are semiconductor device wafers having at least one patterned material layer thereon, such as a metal layer, a polysilicon layer, a dielectric layer, or another layer used in the fabrication of semiconductor devices. Both visual depictions 100 and 110 include graphic representations of vector data that may be stored numerically in memory of a semiconductor process control system, which may include a display or monitor on which to display the visual depictions 100 and 110 to an operator or process manager in a graphical user interface. The memory may further store statistical data for the first wafer 102 and the second wafer 112, including x-direction data, y-direction data, and r data, or vector length data. This data may include means, 3-sigma data, maximums, and minimums. In practice, many more data points may be collected that are represented in FIGS. 1A and 1B.

As illustrated in FIGS. 1A and 1B, the metrology data of wafers 102 and 112 is represented, and stored in memory, as a set of vectors each for wafers 102 and 112. The set of vectors for wafer 102 includes a vector 104, and the set of vectors for wafer 112 includes a vector 114, as depicted in FIGS. 1A and 1B, respectively. A vector represents a shift in a feature, from one wafer to another. In one example, a feature edge may have shifted a certain amount in a certain direction, as indicated by the vector data. As shown in FIGS. 1A and 1B, the vectors can be different at different locations on the wafer. Accordingly, a vector may show more than a misaligned layer, such as from an alignment procedure in a photolithography process. The metrology data may include widths, heights, thickness, errors therein and/or overlay errors, and/or any other measurable data.

In the visual depictions 100 and 110, the vectors are represented as arrows having a direction and a magnitude. In memory, the sets of vectors may be stored as arrays containing x-direction component values and y-direction component values, with each vector having an x-direction and a y-direction component value. Pairs of x-direction and y-direction component values mathematically represent the direction and magnitude of each vector.

The set of vectors for wafer 102, which includes vector 104, forms a wafer overlay "fingerprint" that can be compared with the corresponding wafer fingerprint formed by the set of vectors for wafer 112. The fingerprints of wafer 102 and 112 may be compared to determine a similarity between the two wafers. In the depicted embodiment, wafer 102 is a control or reference wafer, while wafer 112 is a test or production wafer. By comparing or correlating the fingerprint of wafer 112 with the fingerprint of wafer 102, a single value or score is produced by which the wafer 112 may be determined to be within specification or not.

A fingerprint comparison of wafers 112 and 102 is performed as a comparison of the sets of vectors from the metrology data obtained for both wafers 112 and 102. For example, a first vector in the set of vectors for wafer 112 is compared with a second, corresponding vector in the set of vectors for wafer 102. The first vector and the corresponding vector may be measured at corresponding locations of wafers 112 and 102, such that a corresponding feature of the patterned material layer on each of the two wafers is being compared. Accordingly, the point of origin of the first vector and the corresponding vector may be the same point on each of wafers 112 and 102. For example, vectors 104 and 114 may be corresponding vectors, such that each vector has its origin at a corresponding location. The comparison may determine a degree of similarity between the first vector and the corresponding vector, rather than a degree of difference or dissimilarity. In one embodiment, a correlation function is used to determine the degree of similarity between the two vectors, resulting in a similarity index value. As each vector in the set of vectors for wafer 112 is compared or correlated with a corresponding vector from the set of vectors for wafer 102, a plurality of similarity index values are generated. These similarity index values may then be summed to produce a similarity index to describe the degree of similarity of the wafers 112 and 102 according to the obtained metrology data.

The similarity index provides a correlation of the similarities between two sets of vectors in different wafers. In some embodiments, the correlation function used to obtain the similarity index is a cosine similarity function. While many equations may be used to determine the similarity index, some embodiments of the similarity index may be determined by the following equation:

$$\frac{\sum_{i=1}^{n}(X_{A,i}X_{B,i}+Y_{A,i}Y_{B,i})}{\sqrt{\left[\sum_{i=1}^{n}(X_{A,i}^{2}+Y_{A,i}^{2})\right]\cdot\left[\sum_{i=1}^{n}(X_{B,i}^{2}+Y_{B,i}^{2})\right]}} \quad (1)$$

wherein $A_i$ is the set of vectors from wafer 112, and $B_i$ is the set of vectors from wafer 102. As discussed above, each of $A_i$ and $B_i$ has x-direction components and y-direction components as stored in memory. In equation (1), $X_{A,i}$ and $Y_{A,i}$ are the x-direction components and y-direction components, respectively, of set of vectors $A_i$, while $X_{B,i}$ and $Y_{B,i}$ are the x-direction components and y-direction components of the set of vectors B. In equation (1), i is a positive integer used an index into the sets of vectors $A_i$ and $B_i$, and n is a total number of vectors present in $A_i$, which is the same as the total number of vectors present in $B_i$. In some embodiments, the set of vectors in a fingerprint may be three-dimensional, having a z-direction component in addition to the x-direction and y-direction components already described. Equation (1) may be adapted for use in determining a similarity index based on three-dimensional vectors.

Figure 2:
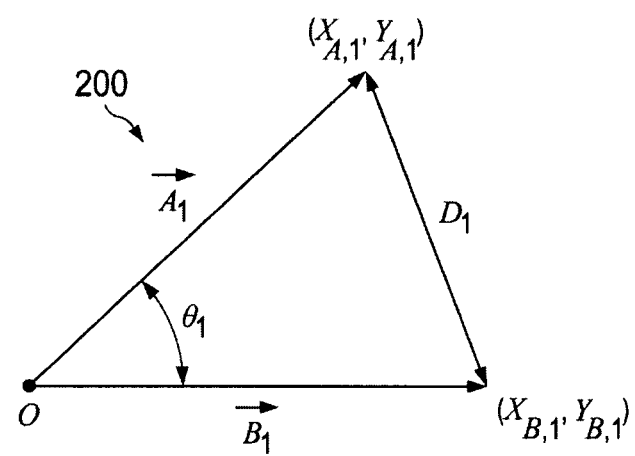
FIG. 2 is vector diagram illustrating a mathematical similarity between two vector components of metrology data.

FIG. 2 is vector diagram 200 illustrating a mathematical relationship between two vector components of metrology data, such as vectors 104 and 114. The vector diagram illustrates two vectors, $A_1$ and $B_1$, which may be understood as corresponding vectors from wafers 112 and 102, each having x-direction and y-direction components. The vectors, sharing an origin O, have an angle $\theta_1$ therebetween, and a third vector $D_1$ having a magnitude and direction extends from the end of vector $A_1$ and to the end of vector $B_1$. The cosine of angle $\theta_1$ provides a value ranging between −1 and 1, such that positive values closer to 1 indicate a higher degree of similarity. Given the increasingly smaller tolerances permitted in semiconductor device processes as the scale of devices decreases, a similarity index as close to 1 as possible is desired. A similarity index below a threshold value may be discarded as unsuitable. The correlation between individual vectors from sets $A_i$ and $B_i$ may be determined as in FIG. 2. A similarity index for the sets $A_i$ and $B_i$ and for the wafers 112 and 102, is determined as in equation (1). When wafer 102 is a control wafer, the similarity index may be thought of as associated with wafer 112, and it may be used to describe the similarity of wafer 112 to the control.

Figure 3:
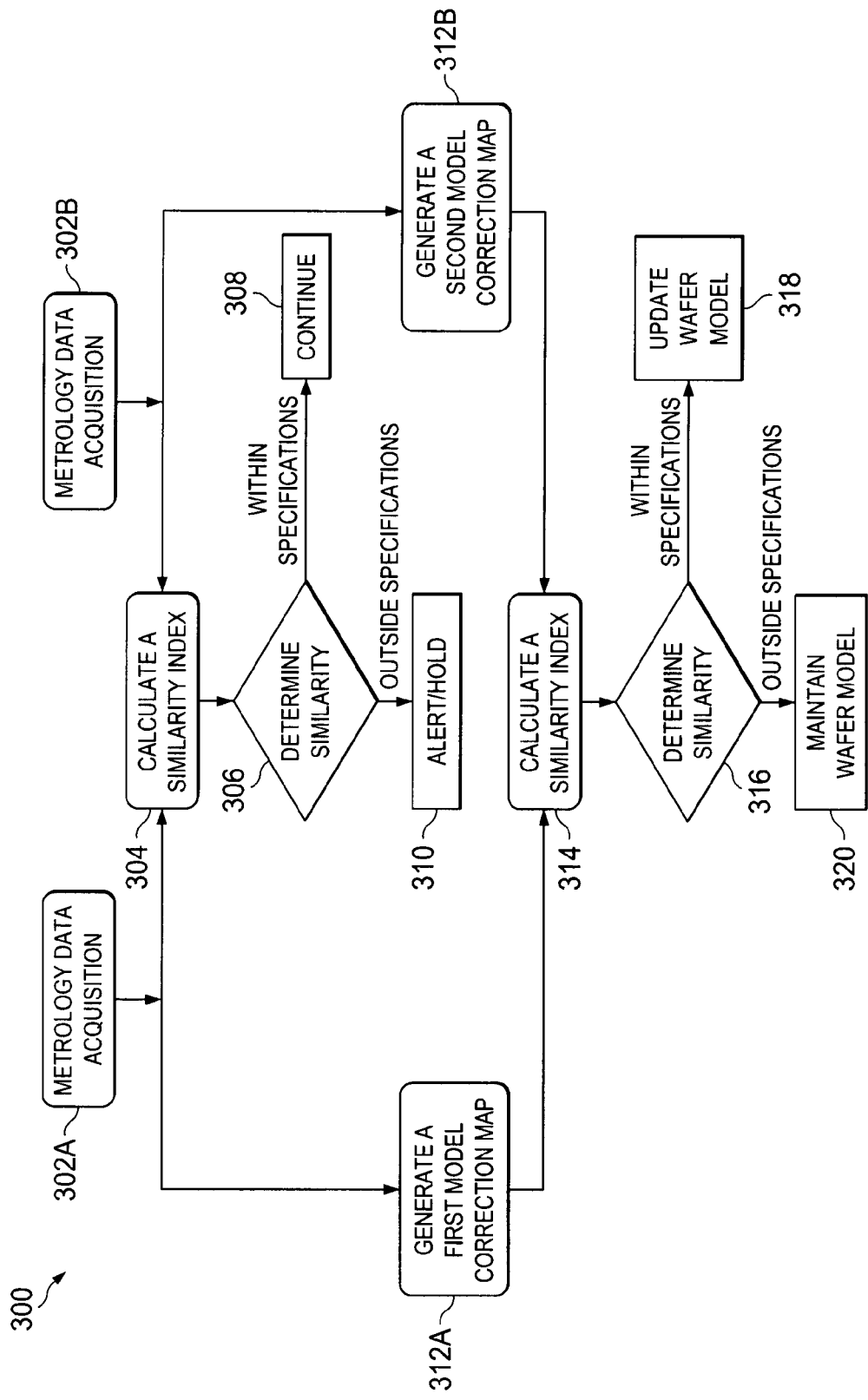
FIG. 3 is flowchart of a method of semiconductor fabrication process control and of modeling semiconductor device fabrication.

FIG. 3 is flowchart of a method 300 of semiconductor fabrication process control and of modeling semiconductor device fabrication. The method 300 includes a plurality of steps as illustrated. However, some embodiments of the method 300 may include additional steps before, after, and/or in between the enumerated steps shown in FIG. 3. As depicted, method 300 begins in steps 302A and 302B in which metrology data is collected from two semiconductor device wafers, such as a control or reference wafer, a production or test wafer. In some embodiments, the two semiconductor device wafers are both semiconductor device wafers that are measured against a common control wafer. Using the metrology data obtained from the two wafers in steps 302A and 302B, a similarity index is generated in step 304. In step 306, the similarity of the two wafers is determined, by comparison of the similarity index to a pre-determined threshold value. When the similarity index is within specifications, e.g. greater than the threshold or greater than or equal to the threshold, then semiconductor wafers continue to be produced, in step 308, under a set of process parameters used in the fabrication of the wafers measured and observed in steps 302A and 302B. When the similarity index is outside specifications, e.g. below the pre-determined threshold, an alert may be issued or further wafer production may be placed on hold to allow modification to the set of process parameters in step 310. The alert may be provided by a dedicated light, a sound, and/or text appearing in a process control system interface. The set of process parameters depends on the tool that is used in a particular process step being monitored. Process parameters may include a duration, an angle of incidence, an exposure energy, an acceleration energy, a temperature, a chemical concentration or compound, and many other parameters that are apparent to one of skill in the art.

While some embodiments of the method 300 ends after the determination of similarity as performed in step 306, the illustrated embodiment further includes steps 312A and 312B. In steps 312A and 312B, the metrology data collected in steps 302A and 302B is provided to generate a first model correction map in step 312A and a second model correction map in step 312B. The model correction maps generated in steps 312A and 312B indicate how an existing, computer-generated model or simulation of the patterned material layer or layers on the wafers measured and observed in steps 302A and 302B should be altered to better correspond with the physical wafers. In step 314, the first model correction map and the second model correction map are used to generate a similarity index. In step 316, a determination is made as to whether the first and second model correction maps are sufficiently or insufficiently similar. This involves comparing the similarity index to a threshold value. When the similarity index resulting from the correlation of the first and second model correction maps is within specifications, e.g. greater than or equal to a pre-determined threshold, the computer-generated wafer model is updated in step 318. The model may be updated with either the first or second model correction map, with an average of the first and second model correction maps, or with a correlated model correction map. When the similarity index is outside specifications, e.g. below the pre-determined threshold, the wafer model is maintained in a present state, no changes are made, in step 320. Some embodiments of the method 300 may omit steps 304, 306, 308, and 310.

In order to provide an example of how the method 300 may be performed in practice, more extensive reference will be made to FIGS. 1A and 1B and the descriptions thereof above. In step 302A, the first wafer 102 may be measured and observed by a metrology system to produce metrology data comprising a first set of vectors. In step 302B, the second wafer 112 may be measured and observe by the metrology system to produce a second set of vectors. In some embodiments, first wafer 102 is a reference or control wafer, while the second wafer 112 is a test wafer or a production wafer. A duration of time may elapse between the performance of step 302A and 302B. For example, in some embodiments, two weeks or more may elapse between the performance of step 302A and 302B. In some embodiments, first wafer 102 is a production wafer that was fabricated prior to the second wafer 112.

After the metrology data is available for both wafers 102 and 112, the similarity check of step 304 may be performed according a correlation function, like equation (1) above, that determines the degree of similarity, expressed as a similarity index, between the fingerprints (sets of vectors) of wafers 102 and 112. For example, wafers 102 and 112 may have a similarity index of 0.856 (which may also be expressed as a percentage, 85.6%). In step 306, the index of 0.856 is compared with a threshold, such as 0.70. Other embodiments may include higher or lower threshold values. Because 0.856 is greater than 0.7, the set of process parameters used to fabricate wafer 112 may be used for further wafer production, in step 308. If the index were determined to be 0.67 with a threshold of 0.7, an alert would be issued in step 310 to inform an operator or process/tool manager that the current set of process parameters are inadequate in step 310. Alternatively, or additionally, the production of wafers under the current set of process parameters may be automatically stopped in step 310.

The metrology data obtained in step 302A and 302B is provided to a simulation system in steps 312A and 312B in order to generate the first and second model correction maps. The model correction maps may be used to improve the accuracy of a current computer-generate wafer model by providing data from the actual wafers. As discussed above in connection with steps 302A and 302B, the steps 312A and 312B may occur days, weeks, or months apart in time. For example, the first model correction map may be generated two weeks after the second model correction map, with the first model correction map being stored in memory for the duration of that time. In step 314, a similarity check is performed on the first and second correction maps to provide a similarity index for the maps, or for the second correction map, where the first correction map is generated from a reference or control wafer. If, in step 316, the similarity index is determined to be above a threshold, then the computer-generated wafer model generated by the simulation system is updated, in step 318. If the similarity index is below the threshold, then the wafer model is maintained as is in step 320. Some embodiments of the method 300 may not include modifications to the computer-generated wafer model, such that steps 312A, 312B, 314, 316, 318, and 320 are not performed.

Figure 4:
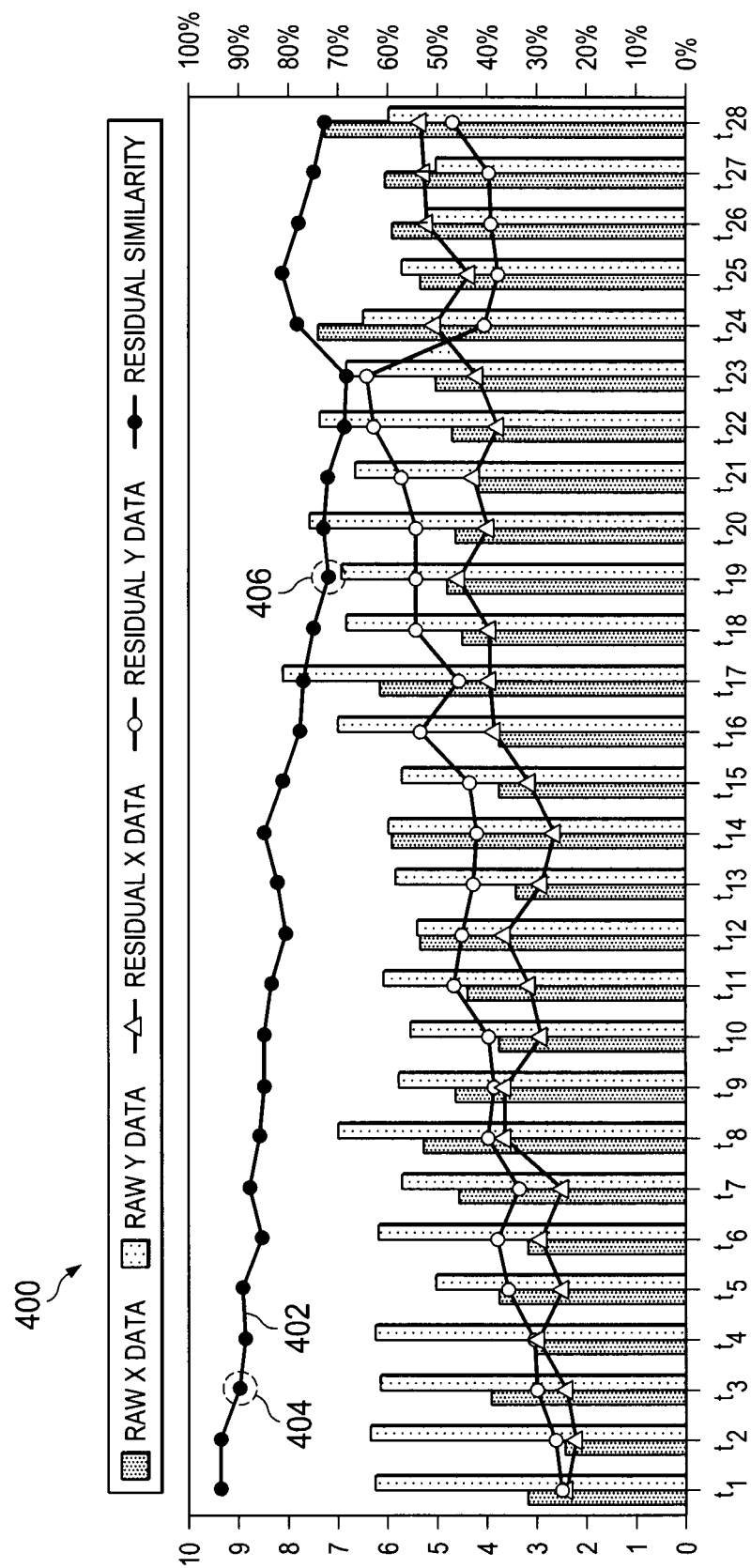
FIG. 4 is an exemplary chart showing exemplary data including the similarity index as measured from sample wafers during production of semiconductor device wafers.

FIG. 4 is an exemplary chart 400 showing exemplary data statistical measurement data and also including similarity index measurements as measured from sample wafers during production of semiconductor device wafers over a period of time. These similarity index measurements form a similarity line 402. The chart 400 may be provided to an operator or process manager through a graphical user interface displayed on a computer display or monitor. In some embodiments of chart 400, only the similarity index measurements of similarity line 402 are displayed. The bottom axis of the chart displays the date on which measurements were obtained using a metrology system. The axis on the left side is in nanometers, while the axis on the right, associated with the similarity line 402, is in percent. A fingerprint of a first production wafer is obtained at $t_3$, and following a method like method 300, a similarity index 404 of about 89% is calculated by correlating the fingerprint of the first production wafer with a fingerprint of a control wafer produced and measured before April 18. This similarity index is stored in memory. Production wafers are tested at regular intervals or times, $t_1$, $t_2$, $t_3$, etc. At $t_{19}$, metrology data is collected from a second production wafer. The fingerprint of the second production wafer is correlated with the control wafer to determine that its similarity index 406 is about 72%. A drift in the processing tool can be readily observed in the similarity line between the similarity indices 404 and 406. Assuming that a threshold value of 0.70 or 70% is used, an alert may be issued and/or production may be interrupted on $t_{23}$, when the similarity index of the production wafer tested on that day is no longer within specification. The set of process parameters may be changed in response.

Figure 5A:
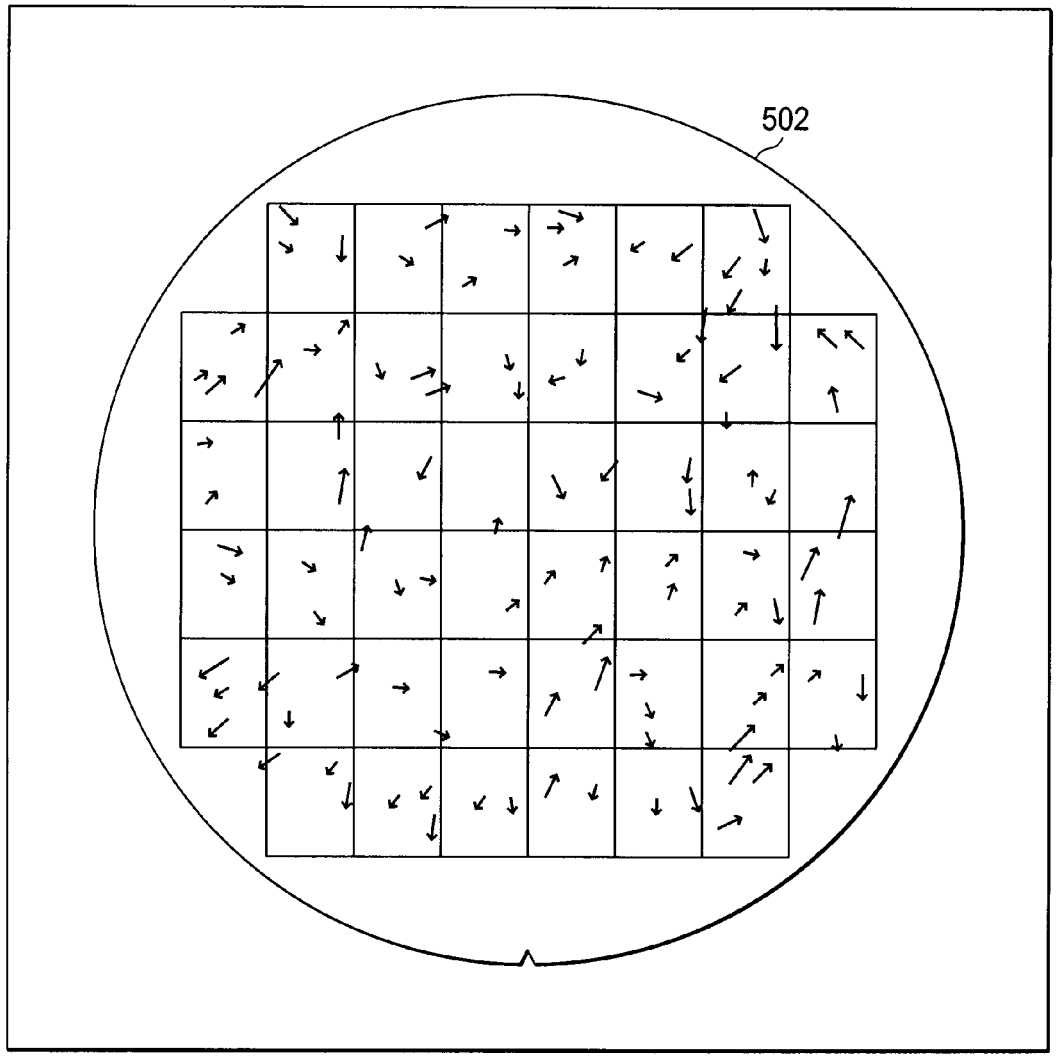
FIGS. 5A, 5B, and 5C illustrates metrology data obtained from two wafers according to some embodiments of the present disclosure.
Figure 5B:
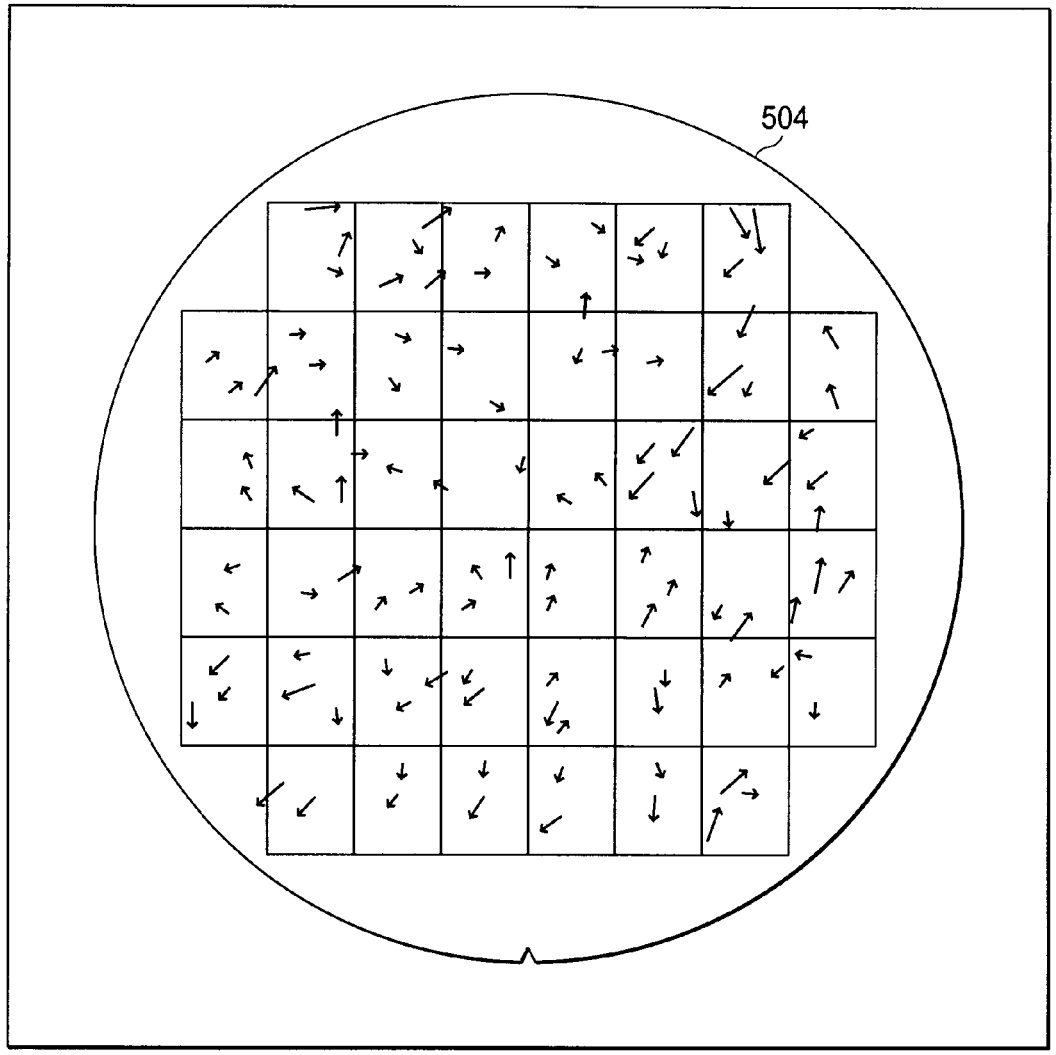
Figure 5C:
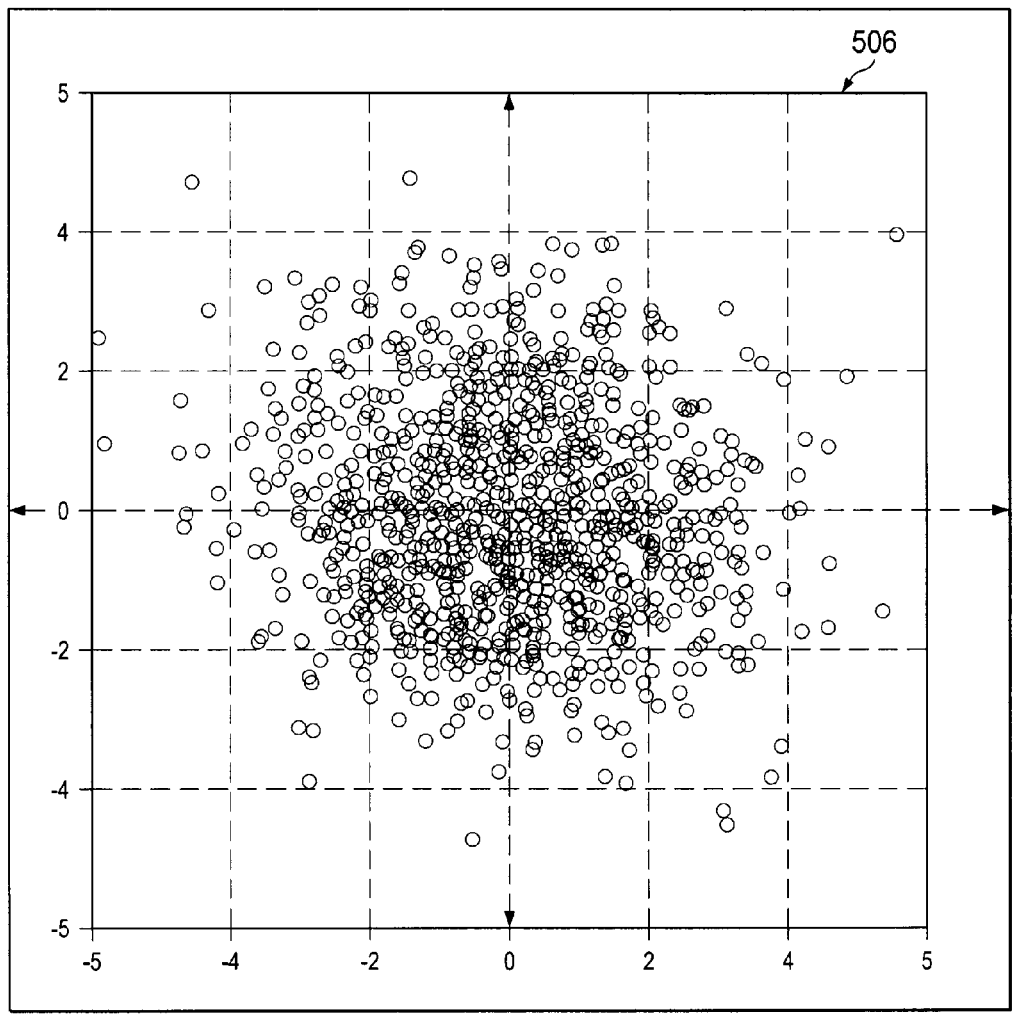

FIGS. 5A, 5B, and 5C illustrates metrology data obtained from two wafers according to some embodiments of the present disclosure. FIG. 5A depicts the fingerprint of a control wafer 502 as referred to in the description of FIG. 4, while FIG. 5B is the fingerprint of the first production wafer 504 referred to (but without the reference number 504) in the description of FIG. 4. As illustrated in FIG. 4 and discussed above, the similarity index for wafer 504 and the control wafer 502 is about 89%. FIG. 5C provides an alternative view 506 of the statistical differences between the wafer 504 and the control wafer 502. The alternative view 506 may be provided to a process manager to facilitate the monitoring of the process.

Figure 6A:
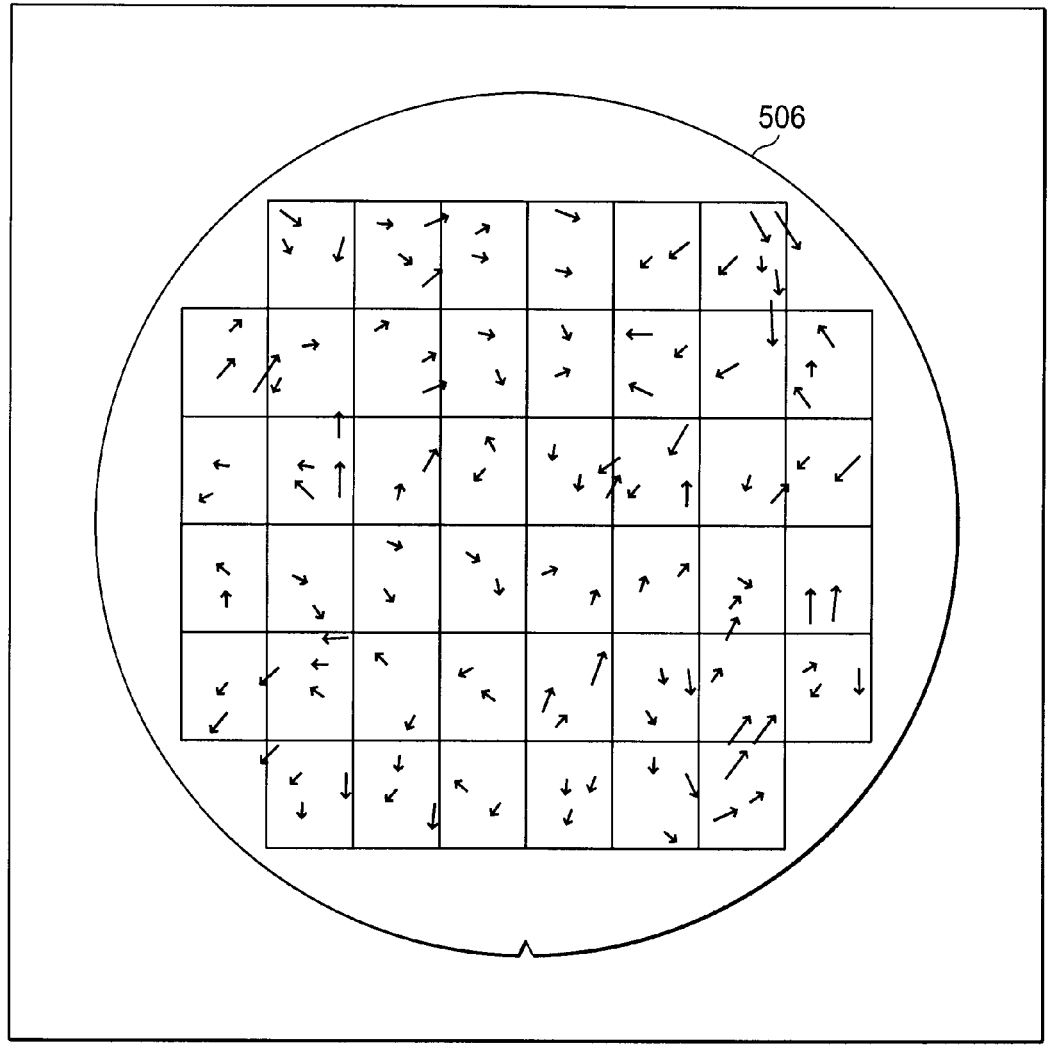
FIGS. 6A, 6B, and 6C illustrates metrology data obtained from two wafers according to some embodiments of the present disclosure.
Figure 6B:
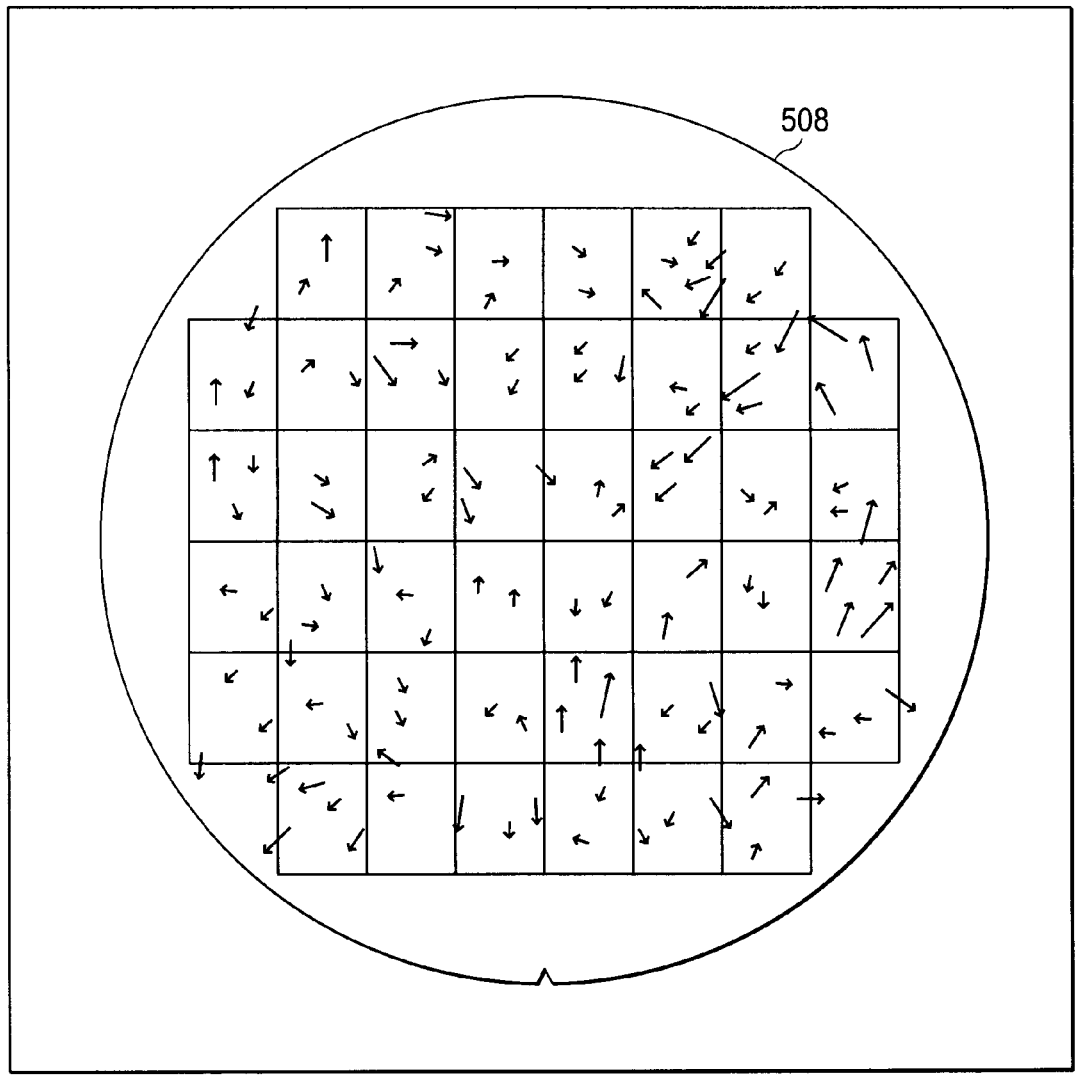
Figure 6C:
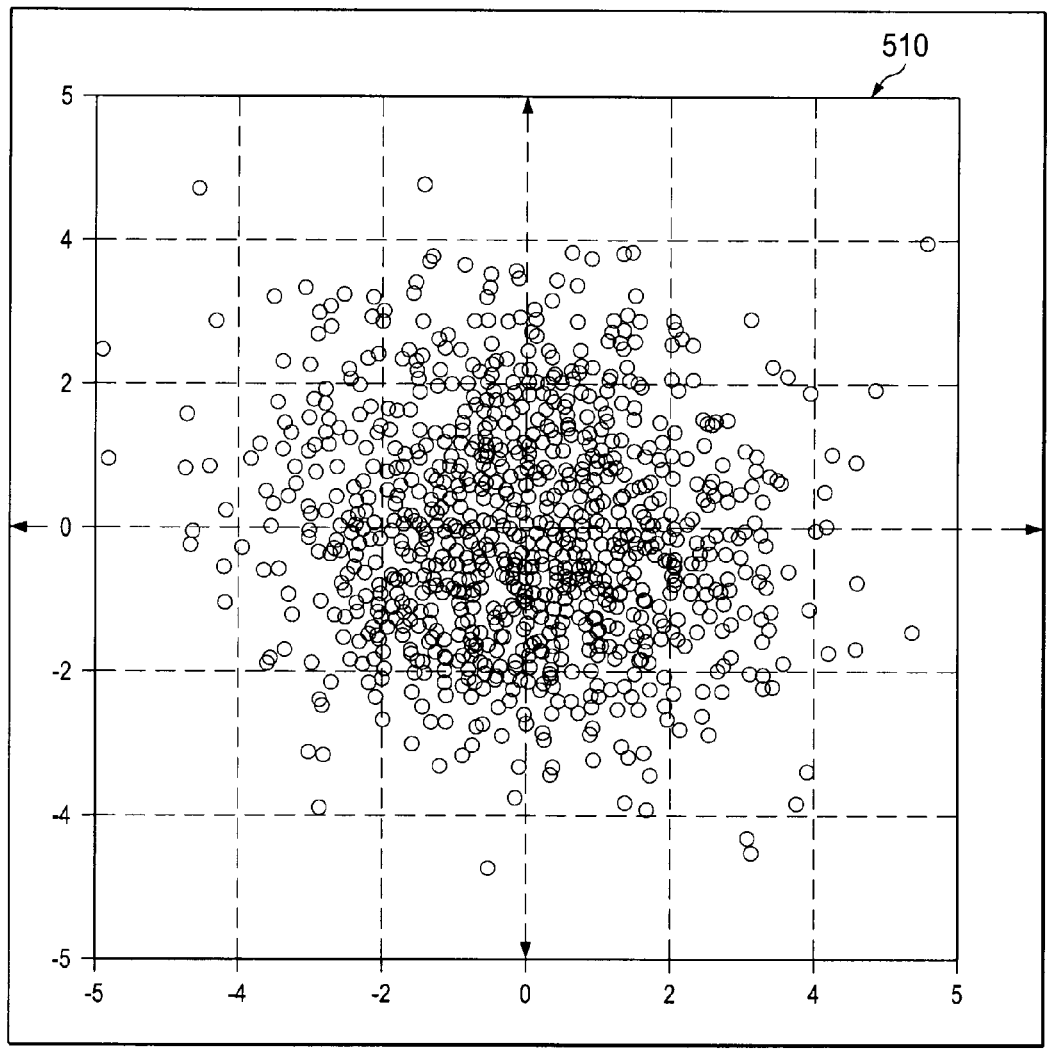

FIGS. 6A, 6B, and 6C illustrates metrology data obtained from two wafers according to some embodiments of the present disclosure. FIG. 6A depicts in the finger print of the control wafer 502 referred to in connection with FIG. 4 and depicted in FIG. 5A. FIG. 6B depicts the fingerprint of the second production wafer 508, which has a similarity index of about 72%. FIG. 6C provides an alternative view 510 of the statistical differences between the production wafer 504 and the control wafer 502. While the alternative views 506 and 510 of FIGS. 5C and 6C may provide certain benefits in assessing the fidelity of wafers 504 and 508 to the control wafer, the similarity indices achieved by method 300 may provide a process manager with a simpler, more objective indicator of process performance.

Figure 7:
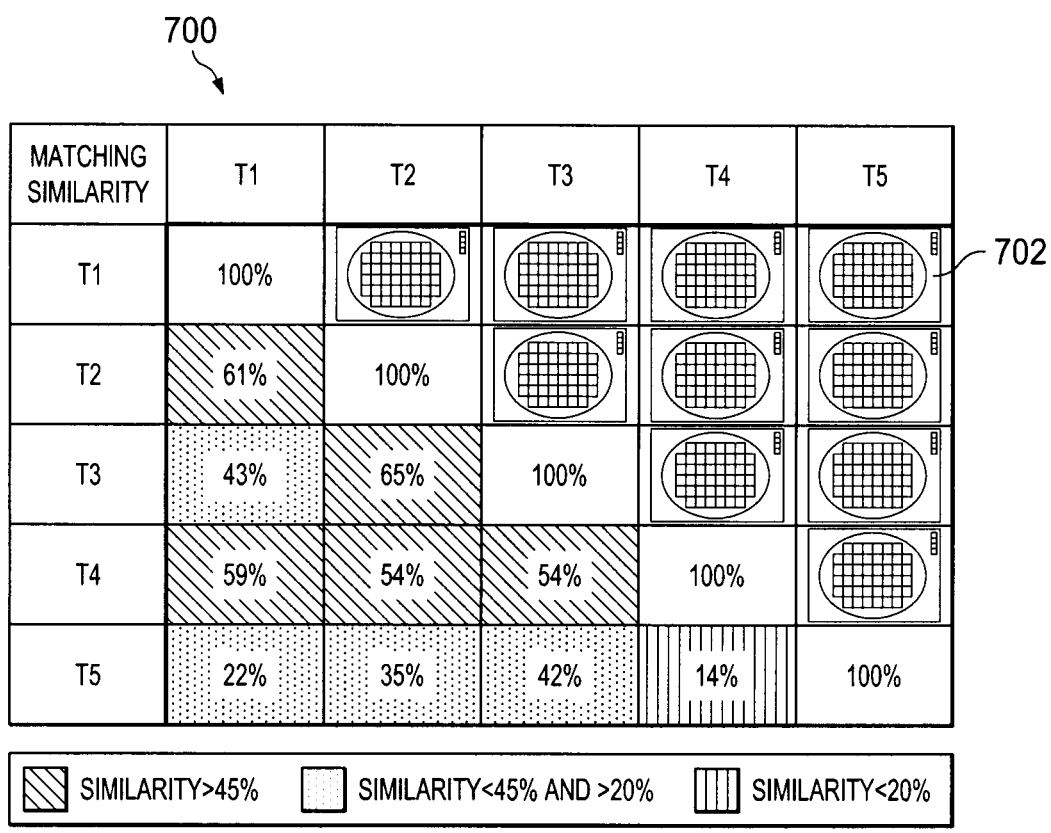
FIG. 7 is a representation of a tool matching matrix such as is provided to an operator in a graphical user interface according to some embodiments of the present disclosure.

FIG. 7 is a representation of a tool matching matrix 700 such is provided to an operator of a process control system in a graphical user interface according to some embodiments of the present disclosure. The tool matching matrix 700 allows a process controller to use the similarity index as disclosed above in connection with FIGS. 1A-B, 2, 3, 4, 5A-D, and 6A-C to verify the compatibility of multiple tools used to provide a same process, like an etch process, in semiconductor device wafer fabrication. Such a process might be an etch process, a deposition, or another semiconductor fabrication process. Along the left hand column and the top row, the tools used for a given process are listed, such that a diagonal line bisecting the matrix indicates where a tool intersects itself, referred to as the identity diagonal. Along this line, the similarity indices are 100%. On the right side of the identity diagonal, is a plurality of icons, like exemplary icon 702, which may be used to display the correlated vector set of a test wafer from a tool BB4 correlated with test wafer from a tool A2. On the left hand side of the identity diagonal, the similarity indices generated by correlating a resulting wafer from each tool with a resulting wafer from each other tool in order to determine what tools can be used together while maintaining satisfactorily consistent results.

A visual representation, such as color-coding, may be used to visual indicate which tools may be used in conjunction and which may not. Three brackets are used in the depicted embodiments, defined by two threshold values. When a similarity index is calculated for two tools as being above 45%, the tools may be used to process runs of the same devices with good results. When the similarity matrix is below 20%, the two tools should not be used for the same runs. When the similarity matrix is between these two threshold values, caution should be exercised. In some embodiments of the tool matching matrix, only a single threshold value is used to delineate acceptable from unacceptable combinations. As matrix 700 is illustrated, the similarity indices are also depicted with the x-direction and y-direction mean error measurements. These measurements may not be present in all embodiments.

Figure 8:
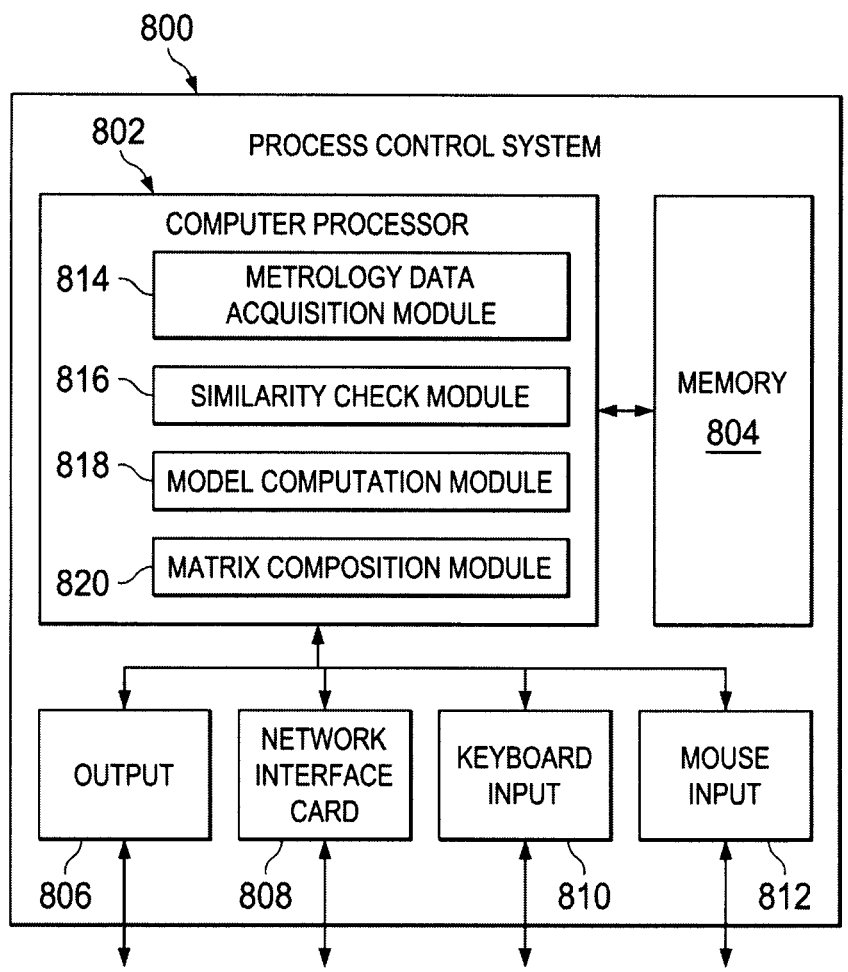
FIG. 8 is a diagrammatic representation of a process control system according to some embodiments of the present disclosure.

FIG. 8 is a diagrammatic representation of a process control system 800 according to some embodiments of the present disclosure. The process control system 800 may be used to perform all or part of method 300 as described above and illustrated in FIG. 3. The process control system includes one or more processors, depicted in FIG. 8 as a single computer processor 802. The process control system 800 further includes a memory 804. Memory 804 may comprise one or more types of memory and one or more memory modules. For example, various embodiments of memory 804 may include a hard-disk drive, solid-state memory, multiple hard-disk drives, or combination of hard-disk and solid-state memory. Any memory that may be adapted to communicate with processor 802 may be suitable.

The process control system 800 further includes a plurality of outputs like output 806 and a network interface card (NIC) 808. In some embodiments, the output 806 is coupled to a display in order to provide visual information to an operator or process manager through a graphical user interface. A plurality of inputs is also provided by process control system 800, like a keyboard input 810 and a mouse input 812. The NIC 808 also functions as an input the system 800. Other inputs and outputs are present in other embodiments.

A plurality of modules is provided by the control system 800. The modules may retrieve data stored in memory 804, receive data from each other, process data, and store data in memory 804. The modules include a metrology data acquisition module 814. The metrology data acquisition module 814 is used to acquire metrology data from semiconductor device wafers as in steps 302A and 302B of method 300 as depicted in FIG. 3. The metrology data acquisition module 814 is configured to communicate with the memory 804 to store the metrology data for later use. Similarity check module 816 accepts metrology data and computes it with a correlation function to determine a similarity index as described in connection with step 304 of method 300. In some embodiments, the correlation function is equation (1) as included herein.

The modules of system 800 further include a model computation module 818 that generates simulations or models of wafers during various stages of production. The model computation module 818 may accept semiconductor design layouts and simulate them to identify defects before fabrication based on the layout has begun. The model computation module 818 may be updated to more accurately simulate the performance of tools or materials used during semiconductor device fabrication. A matrix composition module 820 is also provided as part of system 800. The matrix composition module 820 accesses memory 804 to retrieve metrology data for many wafers fabricated using a plurality of processing tools. The module 820 may cause a matrix, like matrix 700 of FIG. 7, to be displayed to an operator of the system 800 on a coupled display.

In some embodiments of process control system 800, the modules 814, 816, 818, and 820 are included as executable code stored in memory 804, that when executed by processor 802 causes the system 800 to perform the functions as described above. In some embodiments, at least some of the modules are provided by hardware devices, such as a stand-alone metrology tool. Thus, in some embodiments, the described components of system 800 may be provided within a single housing, while in others embodiments multiple housings are used to contain all of the components of the process control system 800.

As discussed, some embodiments of process control system 800 include tangible, non-transient machine-readable media that include executable code that when run by a processor, such the computer processor 802, cause the processor to perform the steps of method 300 as described above. Some forms of machine-readable media that may include executable instructions for the steps of method 300 are floppy disks, flexible disks, hard disks, magnetic tapes, any other magnetic medium, CD-ROM, any other optical medium, RAM, PROM, EPROM, FLASH-EPROM, any other memory chip or cartridge, and/or any other medium from which a processor or computer is adapted to read. The machine-readable media may be memory 804 of FIG. 8.

In one exemplary aspect, the present disclosure describes a method of semiconductor fabrication process control. The method includes steps of receiving a first semiconductor device wafer that has a first patterned material layer thereon and being fabricated under a first set of parameters and of receiving a second semiconductor device wafer that has a second patterned material layer thereon. The first and second patterned material layers are patterned with a common mask. The method includes a step of collecting metrology data from the first and second semiconductor device wafers. The metrology data includes a first set of vectors associated with the first semiconductor device wafer and a second set of vectors associated with the second semiconductor device wafer. The method also includes steps of determining a similarity index based in part on a similarity index value between a vector from the first set of vectors and a vector from the second set of vectors and of continuing to process additional wafers under the set of parameters when the similarity index is above a threshold value.

In another exemplary aspect, another method for modeling semiconductor device fabrication is included. The method includes steps of receiving a first semiconductor device wafer and a second semiconductor device wafer. The first semiconductor device wafer has a first patterned material layer thereon and is fabricated under a set of parameters. The second semiconductor device wafer also has a patterned material layer on a surface thereof; the first and second patterned material layers being patterned with a common mask. The method further includes steps of collecting metrology data from the first and second semiconductor device wafers and comparing the metrology data with modeled data provided by a computer model to generate a first correction map and a second correction map. The first correction map is associated with the first semiconductor device wafer and the second correction map is associated with the second semiconductor device wafer. The method also includes steps of determining a similarity index by comparison of the first and second correction maps and of updating the computer model when the similarity index is above a threshold value.

In an additional exemplary aspect, the present disclosure includes a process control system. As disclosed, an embodiment of the process control system includes one or more processors that are in communication with a memory. The system further includes one or more system inputs configured to facilitate control by an operator and communication with external devices and one or more system outputs also configured to facilitate use by the operator, with at least one system output providing communication to a display. The system has a plurality of modules including a metrology data acquisition module and a similarity check module. The metrology data acquisition module is configured to acquire metrology data from plurality of semiconductor device wafers, including a first semiconductor device wafer and a control wafer. The metrology data from the first semiconductor device wafer and the control wafer is stored in the memory. The similarity check module is configured to determine a similarity index of a first semiconductor device wafer by comparing the first semiconductor device wafer with a control wafer. The similarity check module further outputs an indication of whether the similarity index is above a threshold value.

The examples provided above are exemplary. They are not intended to be limiting. One skilled in the art may readily devise other systems and methods consistent with the disclosed embodiments. These other systems and methods are intended to be within the scope of this disclosure. As such, the disclosure is limited only by the following claims.

What is claimed is:

1. A method for semiconductor fabrication process control, the method comprising:
   receiving a first semiconductor device wafer, the first semiconductor device wafer having a first patterned material layer thereon and being fabricated under a first set of parameters;
   receiving a second semiconductor device wafer, the second semiconductor device wafer having a second patterned material layer thereon, the first and second patterned material layers being patterned with a common mask;
   collecting metrology data from the first and second semiconductor device wafers, the metrology data including a first set of vectors associated with the first semiconductor device wafer and a second set of vectors associated with the second semiconductor device wafer;
   determining a similarity index based in part on a similarity index value between a first vector from the first set of vectors and a second vector from the second set of vectors; and
   continuing to process additional wafer under the first set of parameters when the similarity index is above a threshold value.

2. The method of claim 1, further comprising ceasing production of additional wafers under the first set of parameters when the similarity index is below the threshold value.

3. The method of claim 1, wherein the second semiconductor device wafer is a control wafer.

4. The method of claim 1, wherein determining the similarity index based in part on a similarity index value comprises using the first vector and the second vector in a correlation function.

5. The method of claim 1, wherein determining the similarity index based in part on a similarity index value further comprises determining the similarity index based on a plurality of similarity index values.

6. The method of claim 1, wherein the similarity index is calculated as a cosine similarity between the first set of vectors and the second set of vectors.

7. The method of claim 6, wherein the cosine similarity between the first set of vectors and the second set of vectors is equal to $$\frac{\sum_{i=1}^{n} (X_{A,i} X_{B,i} + Y_{A,i} Y_{B,i})}{\sqrt{\left[\sum_{i=1}^{n} (X_{A,i}^2 + Y_{A,i}^2)\right] \cdot \left[\sum_{i=1}^{n} (X_{B,i}^2 + Y_{B,i}^2)\right]}}$$

and wherein:
   i is an integer index variable;
   $A_i$ is the first set of vectors and has x-direction components $X_{A,i}$ and y-direction components $Y_{A,i}$; and
   $B_i$ is the second set of vectors and has x-direction components $X_{B,i}$ and y-direction components $Y_{B,i}$; and
   n is a total number of vectors present in the first set of vectors.

8. The method of claim 1, wherein the first and second patterned material layers are patterned using a common tool.

9. The method of claim 8, wherein the first semiconductor device wafer is fabricated at a first time, the second semiconductor device wafer is fabricated at a second time, and a third semiconductor device wafer is fabricated at a third time, the third wafer including a third patterned material layer patterned using the common mask and the common tool, the third time being after the second time, and the second time being after the first time, and further comprising:
   collecting metrology data from the third semiconductor device wafer, the metrology data including a third set of vectors associated with the third semiconductor device wafer;
   determining an additional similarity index based in part on a similarity index value between a first vector from the first set of vectors and a third vector from the third set of vectors; and
   comparing the similarity index to the additional similarity index to determine a drift associated with the common tool.

10. The method of claim 1, further comprising:
    comparing the first set of vectors with a computer-modeled wafer to generate a first model correction map;

comparing the second set of vectors with a computer-modeled wafer to generate a second model correction map;

determining an additional similarity index based on a correlation of the first and second model correction maps; and modifying a computer model according to the additional similarity index.

11. A method for modeling semiconductor device fabrication, the method comprising:

receiving a first semiconductor device wafer, the first semiconductor device wafer having a first patterned material layer thereon and being fabricated under a set of parameters;

receiving a second semiconductor device wafer, the second semiconductor device wafer having a patterned material layer on a surface thereof, the first and second patterned material layers being patterned with a common mask;

collecting metrology data from the first and second semiconductor device wafers;

comparing the metrology data with modeled data provided by a computer model generated from a layout of the common mask to generate a first correction map associated with the first semiconductor device wafer and a second correction map associated with the second semiconductor device wafer;

determining a similarity index by comparison of the first and second correction maps; and updating the computer model when the similarity index is above a threshold value.

12. The method of claim 11, wherein the first semiconductor device wafer is a production wafer and the second semiconductor device wafer is a control wafer that is fabricated earlier in time that the production wafer.

13. The method of claim 11, wherein determining the similarity index comprises using a first set of vectors from the first correction map and a second set of vectors from the second correction map in a correlation function.

14. The method of claim 13, wherein the similarity index is calculated as a cosine similarity between the first set of vectors and the second set of vectors.

15. The method of claim 14, wherein the cosine similarity between the first set of vectors and the second set of vectors is equal to $$\frac{\sum_{i=1}^{n}(X_{A,i}X_{B,i}+Y_{A,i}Y_{B,i})}{\sqrt{\left[\sum_{i=1}^{n}(X_{A,i}^2+Y_{A,i}^2)\right]\cdot\left[\sum_{i=1}^{n}(X_{B,i}^2+Y_{B,i}^2)\right]}}$$

and wherein:

i is an integer index variable;

$A_i$ is the first set of vectors, each vector of the first set of vectors having an x-direction component $X_{A,i}$ and a y-direction component $Y_{A,i}$; and $B_i$ is the second set of vectors, each vector of the second set of vectors having an x-direction components $X_{B,i}$ and y-direction components $Y_{B,i}$; and n is a total number of vectors present in the first set of vectors.

16. A semiconductor device fabrication process control system comprising:

one or more processors, the one or more processors being in communication with a memory;

one or more system inputs configured to facilitate control by an operator and communication with external devices;

one or more system outputs configured to facilitate use by the operator, at least one system output providing communication to a display;

a metrology data acquisition module configured to acquire metrology data from plurality of semiconductor device wafers that includes a first semiconductor device wafer and a control wafer, the metrology data from the first semiconductor device wafer and the control wafer being used to generate a first set of vectors describing the semiconductor device wafer and a second set of vectors describing the control wafer, the first and second sets of vectors being stored in the memory;

a similarity check module configured to determine a similarity index of a first semiconductor device wafer by comparing the first semiconductor device wafer to a control wafer, the similarity check module further configured to output an indication of whether the similarity index is above a threshold value.

17. The system of claim 16, further comprising:

a model computation module configured to provide a predictive computer model of the first semiconductor device wafer and to compare the predictive computer model with the metrology data from the first semiconductor device wafer to generate a first model correction map and with the metrology data from the control wafer to generate a second model correction map; and wherein the similarity check module is further configured to determine an additional similarity index by comparing the first model correction map with the second model correction map and to output an indication of whether the additional similarity index is above a threshold value.

18. The system of claim 17, wherein the metrology data acquisition module acquires metrology data from a coupled metrology data acquisition system.

19. The system of claim 16, further comprising a similarity matrix module configured to:

access metrology data for the plurality of semiconductor device wafers stored in the memory, the metrology data for each of the plurality of semiconductor device wafers being associated in memory with an associated processing tool of a plurality of processing tools; and generate a tool matching matrix.

20. The system of claim 19, wherein the tool matching matrix indicates a compatibility of a first processing tool with a second processing tool of the plurality of processing tools.

* * * * *